United States Patent

Unami et al.

[11] Patent Number: 5,939,819
[45] Date of Patent: Aug. 17, 1999

[54] ELECTRONIC COMPONENT AND LADDER FILTER

[75] Inventors: Toshihiko Unami; Jiro Inoue, both of Omihachiman; Tetsuo Takeshima, Toyama, all of Japan

[73] Assignee: Murata Manufacturing Co., Ltd., Kyoto, Japan

[21] Appl. No.: 08/831,243

[22] Filed: Apr. 2, 1997

[30] Foreign Application Priority Data

| Apr. 18, 1996 | [JP] | Japan | 8-122725 |
| Jun. 8, 1996 | [JP] | Japan | 8-224430 |
| Jan. 10, 1997 | [JP] | Japan | 9-014585 |
| Jan. 16, 1997 | [JP] | Japan | 9-020102 |

[51] Int. Cl.$^6$ .................................................. H01L 41/08
[52] U.S. Cl. ......................... 310/366; 310/348; 333/189
[58] Field of Search .................................. 310/311, 366, 310/368, 367, 348, 344, 313 R; 333/189

[56] References Cited

U.S. PATENT DOCUMENTS

| 2,157,665 | 5/1939 | Hollmann | 310/315 |
| 3,185,869 | 5/1965 | Shoor | 310/315 |
| 3,297,889 | 1/1967 | Breskend | 310/315 |
| 3,401,275 | 9/1968 | Curran et al. | 310/320 |
| 3,590,287 | 6/1971 | Berlincourt et al. | 310/366 X |
| 4,087,716 | 5/1978 | Haywang | 310/359 X |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

FOREIGN PATENT DOCUMENTS

| 5-160459 | 6/1993 | Japan | 310/366 |

*Primary Examiner*—Mark O. Budd
*Attorney, Agent, or Firm*—Graham & James LLP

[57] ABSTRACT

A ladder filter has a piezoelectric resonator having reduced spurious vibrations and having a wider range of selection of the difference ΔF between the resonant frequency and the antiresonant frequency, and has a substantially reduced size. The ladder filter includes an insulating substrate on which four pattern electrodes are provided. Four lands are respectively formed as portions of the four pattern electrodes. Another land is formed as a portion of the second pattern electrode. External electrodes of four piezoelectric resonators adapted to vibrate in a longitudinal vibration mode and capable of being mounted in a surface mount manner are connected to the land of the pattern electrodes by supporting members made of an electroconductive material. The four piezoelectric resonators are arranged in a row in the order of a first series resonator, a first parallel resonator, a second parallel resonator and a second series resonator.

15 Claims, 17 Drawing Sheets

ELECTRONIC COMPONENT AND LADDER FILTER

BACKGROUND OF THE INVENTION

1. Field of the Invention

The present invention relates to an electronic component and a ladder filter and, more particularly, to an electronic component such as a ladder filter including a plurality of electronic component elements containing a piezoelectric resonator which is adapted to maximize efficient use of mechanical vibration of a piezoelectric body.

2. Description of the Related Art

FIG. 19 is a perspective view of a conventional piezoelectric resonator 1 related to the present invention. The piezoelectric resonator 1 includes a single piezoelectric substrate 2 in the form of, for example, a flat block having rectangular major surfaces. The single piezoelectric substrate 2 is polarized along the direction of thickness thereof. Electrodes 3 are disposed on opposite major surfaces of the piezoelectric substrate 2. When a signal is input between the electrodes 3, an electric field is applied to the single piezoelectric substrate 2 along the direction of the thickness of the single piezoelectric substrate 2. The single piezoelectric substrate 2 vibrates in the longitudinal direction.

FIG. 20 shows a piezoelectric resonator 1 including a single piezoelectric substrate 2 in the form of a flat block having square major surfaces, and electrodes 3 disposed on the two opposite major surfaces of the single piezoelectric substrate 2. Also in this piezoelectric resonator 1, the single piezoelectric substrate 2 is polarized along the direction of the thickness thereof. When a signal is input between the electrodes 3 in the piezoelectric resonator 1, an electric field is applied to the single piezoelectric substrate 2 along the direction of the thickness and the single piezoelectric substrate 2 vibrates in a square-type vibration mode (in a plane direction).

The piezoelectric resonators shown in FIGS. 19 and 20 are of an unstiffened type, in which the direction of an electric field and the direction of polarization differ from the direction of vibration. The electromechanical coupling coefficient of such unstiffened piezoelectric resonators is smaller than that of stiffened piezoelectric resonators, in which the direction of an electric field, the direction of polarization and the direction of vibration are the same.

Unstiffened piezoelectric resonators have a relatively small difference ΔF between the resonant frequency and the antiresonant frequency. This leads to a disadvantage of restricting a filter band width if this type of piezoelectric resonator is used in a filter. Therefore, the degree of freedom and flexibility in resonator characteristics design is low when an electronic component uses this type of piezoelectric resonator.

The piezoelectric resonator shown in FIG. 19 uses the longitudinal first-order resonance mode. Because of its structure, the piezoelectric resonator of FIG. 19 also generates large spurious resonances in odd-number-order harmonic modes, such as the third-order and fifth-order modes, and in width modes. To suppress these spurious resonances, some solutions have been considered, such as polishing, increasing mass, and changing the shape of the electrodes. These solutions, however, increase the manufacturing cost.

In addition, since the single piezoelectric substrate has the shape of a flat block having rectangular major surfaces, the substrate cannot be made thinner due to a restriction relating to strength. Therefore, the distance between the electrodes cannot be reduced and the capacitance between terminals cannot be increased. This makes it extremely difficult to achieve impedance matching with an external circuit. To form a ladder filter by alternately connecting a plurality of piezoelectric resonators in series and in parallel, the capacitance ratio of the parallel resonators and the series resonators needs to be made large in order to increase attenuation. Because of the above-described shape and structural restrictions, however, large attenuation cannot be obtained.

In the piezoelectric resonator shown in FIG. 20, the plane-direction first-order vibration mode is used but large spurious resonances such as those in the thickness mode and in the triple-wave mode in the plane direction are generated because of the structure of the resonator 1. Since this piezoelectric resonator must have a large size as compared with a piezoelectric resonator using longitudinal vibration in order to obtain the same resonant frequency, it is difficult for the size of this piezoelectric resonator to be reduced. When a ladder filter is formed by a plurality of piezoelectric resonators, the method of reducing the capacitance of the resonators in the series connection by forming the electrodes only on restricted portions of the piezoelectric substrate as well as increasing the thickness of the series resonators is used in order to increase the capacitance ratio of the parallel resonators to the series resonators. In this case, since the electrodes are only partially formed, the difference ΔF between the resonant frequency and the antiresonant frequency as well as the capacitance is reduced. The resonators connected in parallel are required to have a reduced ΔF. As a result, the piezoelectricity of the piezoelectric substrate is not effectively used, and the transmission band width of the filter cannot be increased.

The applicant of the present invention proposed, for example, in the specification of Japanese Patent Application 8-110475 which corresponds to co-pending U.S. patent application Ser. No. 08/829,597 entitled "Piezoelectric Resonator and Electric Component Including Same" (Attorney Docket No. 36856.22), the disclosures of which prior applications are incorporated herein by reference, a piezoelectric resonator in which a plurality of piezoelectric layers and a plurality of electrodes forming a base member preferably having a longitudinal shape are alternately laminated, in which the plurality of piezoelectric layers are polarized along the longitudinal direction of the base member, and in which vibration in the longitudinal fundamental mode is generated. This piezoelectric resonator is a stiffened type resonator and is therefore free from the drawbacks in using the above-described unstiffened piezoelectric resonators.

A ladder filter may be formed by using such a stiffened type piezoelectric resonator, for example, as shown in FIG. 21.

FIG. 21 is an exploded perspective view of a ladder filter 4 using a piezoelectric resonator constructed as described in Japanese Patent Application 8-110475 made by the applicant of the present invention, and FIG. 22 is an exploded perspective view of essential elements of the ladder filter 4. In the ladder filter 4 shown in FIG. 21, three pattern electrodes 6a, 6b, and 6c are preferably provided on an insulating substrate 5. Four supporting members 7a, 7b, 7c, and 7d are preferably formed of an electroconductive adhesive on the pattern electrodes 6a to 6c. The supporting member 7a is formed on the pattern electrode 6a, the supporting members 7b and 7d are disposed on the pattern electrode 6b, and the supporting member 7c is disposed on the pattern electrode 6c. Each of four piezoelectric resonators 1a, 1b, 1c, and 1d has a pair of electrodes 3, one of which is mounted on the corresponding one of the supporting members 7a to 7d. The other electrodes 3 on the three piezoelectric resonators 1a, 1b, and 1c are connected to each other by conductor wires 8. The other electrode 3 of the piezoelectric resonator 1d is connected to the pattern electrode 6c by a conductor wire 8. A metallic cap 9 is placed on the insulating substrate 5. This ladder filter 4 has a ladder type circuit shown in FIG. 23.

Because the ladder filter constructed as shown in FIG. 21 requires conductor wires for connection between the resonators and for connection between the resonators and the pattern electrodes, the process of manufacturing the ladder filter is complicated and there is a limit to the reduction in the size of the ladder filter that can be achieved. Therefore, if the pattern electrodes of this ladder filter are arranged close to each other on the insulating substrate to reduce the size of the component, a stray capacitance is created between the pattern electrodes, so that the amount of attenuation achieved by the filter is reduced. The ability to reduce the size of the component is also limited by the necessity to avoid this undesirable effect.

SUMMARY OF THE INVENTION

To solve the problems described above, the preferred embodiments of the present invention provide an electronic component which has a piezoelectric resonator having reduced spurious responses and having an increased range of selection of the difference ΔF between the resonant frequency and the antiresonant frequency, and which has a substantially reduced size.

According to one preferred embodiment of the present invention, a ladder filter comprises a piezoelectric resonator having reduced spurious vibrations and having an increased range of selection of the difference ΔF between the resonant frequency and the antiresonant frequency, and which has a substantially reduced size.

According to one preferred embodiment of the present invention, there is provided an electronic component comprising an insulating substrate, pattern electrodes disposed on the insulating substrate, at least one electronic component element provided on the insulating substrate, and at least one piezoelectric resonator provided on the insulating substrate and adapted to generate vibration in a longitudinal vibration mode, the piezoelectric resonator including a base member preferably having a substantially longitudinal shape, a plurality of internal electrodes arranged substantially perpendicular to the longitudinal direction of the base member and arranged to extend in the width direction of the base member while being spaced apart from each other, and a pair of external electrodes preferably disposed on one side surface of the base member and alternately connected to the plurality of internal electrodes, the base member including a plurality of laminated piezoelectric layers each of which is polarized along the longitudinal direction of the base member, the plurality of internal electrodes being disposed on surfaces of the piezoelectric layers and arranged substantially perpendicular to the longitudinal direction of the base member, wherein one of the external electrodes of the piezoelectric resonator and an external electrode of the electronic component element are disposed adjacent to each other and are placed on and electrically connected to one of the pattern electrodes.

In the electronic component according to one preferred embodiment of the present invention, the electronic component element may comprise two chip capacitors. One of the external electrodes of the piezoelectric resonator and an external electrode of one of the capacitors arranged adjacent to each other are connected to one of the pattern electrodes. The other of the external electrodes of the piezoelectric resonator and an external electrode of the other of the capacitors disposed adjacent to each other are connected to another of the pattern electrodes. A π-type circuit is thereby formed.

According to another preferred embodiment of the present invention, there is provided a ladder filter comprising an insulating substrate, pattern electrodes disposed on the insulating substrate, and a plurality of piezoelectric resonators provided on the insulating substrate and adapted to generate vibration in a longitudinal vibration mode, each of the piezoelectric resonators including a base member preferably having a substantially longitudinal shape, a plurality of internal electrodes arranged substantially perpendicular to the longitudinal direction of the base member and arranged to extend in the width direction of the base member while being spaced apart from each other, and a pair of external electrodes preferably disposed on one side surface of the base member and alternately connected to the plurality of internal electrodes, the base member including a plurality of laminated piezoelectric layers each of which is polarized along the longitudinal direction of the base member, the plurality of internal electrodes being disposed on surfaces of the piezoelectric layers and arranged to be substantially perpendicular to the longitudinal direction of the base member, wherein two of the external electrodes of two of the piezoelectric resonators disposed adjacent to each other are placed on and electrically connected to one of the pattern electrodes.

In the ladder filter according to the preferred embodiments of the present invention, the plurality of piezoelectric resonators may include, for example, four piezoelectric resonators which define a first series resonator, a second series resonator, a first parallel resonator and a second parallel resonator. The four piezoelectric resonators may be arranged in a row in the order of the first series resonator, the first parallel resonator, the second parallel resonator and the second series resonator.

Alternatively, the first and second series resonators and first and second parallel resonators may be arranged in a row in the order of the first series resonator, the second series resonator, the second parallel resonator and the first parallel resonator.

The piezoelectric resonator used in the electronic component and the ladder filter according to the preferred embodiments of the present invention is a stiffened type resonator in which the direction of vibration coincides with the direction of polarization and the direction of an electric field. As a result, the piezoelectric resonator has a larger electromechanical coupling coefficient than unstiffened piezoelectric resonators in which the direction of vibration is different from the direction of polarization and the direction of an electric field, so that the range of selection of ΔF which is the difference between the resonant frequency and the antiresonant frequency is substantially increased.

The piezoelectric resonator used in the electronic component and the ladder filter according to the preferred embodiments of the present invention is arranged as a stiffened piezoelectric resonator to reduce the possibility of occurrence of vibrations in any modes such as width and thickness modes different from the longitudinal fundamental mode, thus reducing spurious vibrations.

In the electronic component and the ladder filter according to the preferred embodiments of the present invention, external electrodes of the piezoelectric resonators or other electronic component elements can be connected directly to pattern electrodes on the insulating substrate without using any conductive wire. The electronic component and the ladder filter therefore have a reduced size.

In the electronic component and the ladder filter according to the preferred embodiments of the present invention, two external electrodes of an adjacent pair of the piezoelectric resonators or other electronic component elements are placed on and electrically connected to one pattern electrode. Therefore, there is no need for insulation between the external electrodes, and the adjacent electronic component elements can be located close to each other without negatively affecting the resonator characteristics. This arrangement also enables the electronic component and the size of the ladder filter to be substantially reduced.

In the electronic component and the ladder filter according to the preferred embodiments of the present invention, two external electrodes of an adjacent pair of the piezoelectric resonators or other electronic component elements are preferably placed on and electrically connected to one pattern electrode. Therefore, simpler pattern electrodes for connection of the electronic component elements can be formed on the insulating substrate instead of complicated pattern electrodes to achieve a further reduction in size.

According to the preferred embodiments of the present invention, an electronic component has a piezoelectric resonator having reduced spurious vibrations and an increased range of selection of the difference ΔF between the resonant frequency and the antiresonant frequency, and has a substantially reduced size.

Also, according to the preferred embodiments of the present invention, a ladder filter has a piezoelectric resonator having reduced spurious vibrations and an increased range of selection of the difference ΔF between the resonant frequency and a substantially reduced size.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
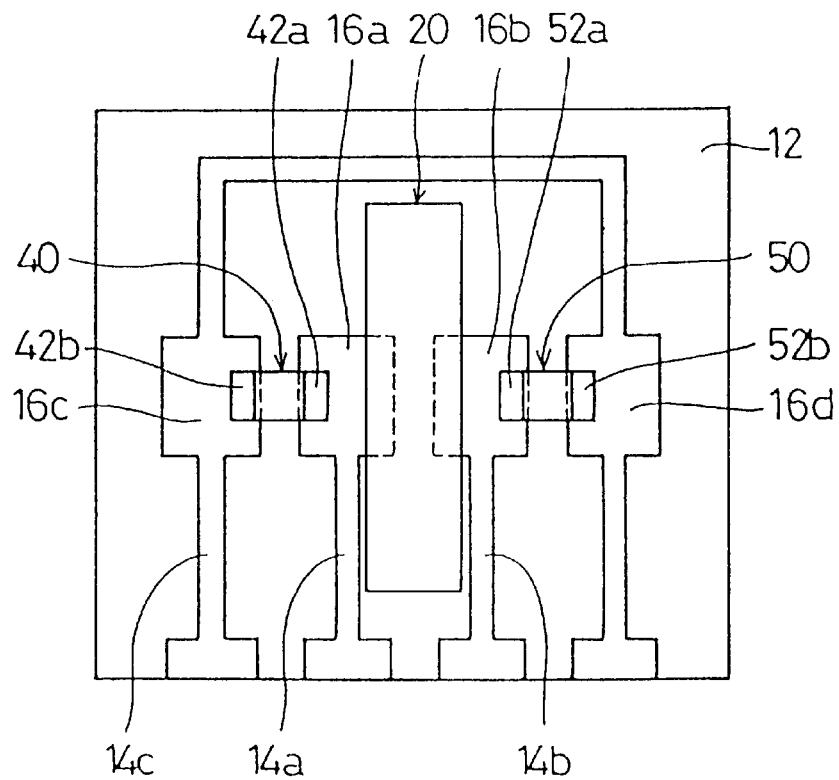
FIG. 1 is a plan view of an example of a capacitor incorporation type oscillator in accordance with a preferred embodiment of the present invention.
Figure 2:
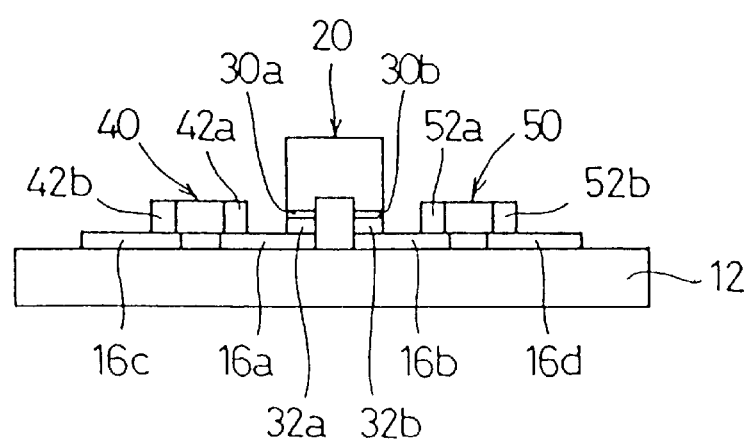
FIG. 2 is a front view of the capacitor incorporation type oscillator shown in FIG. 1.
Figure 3:
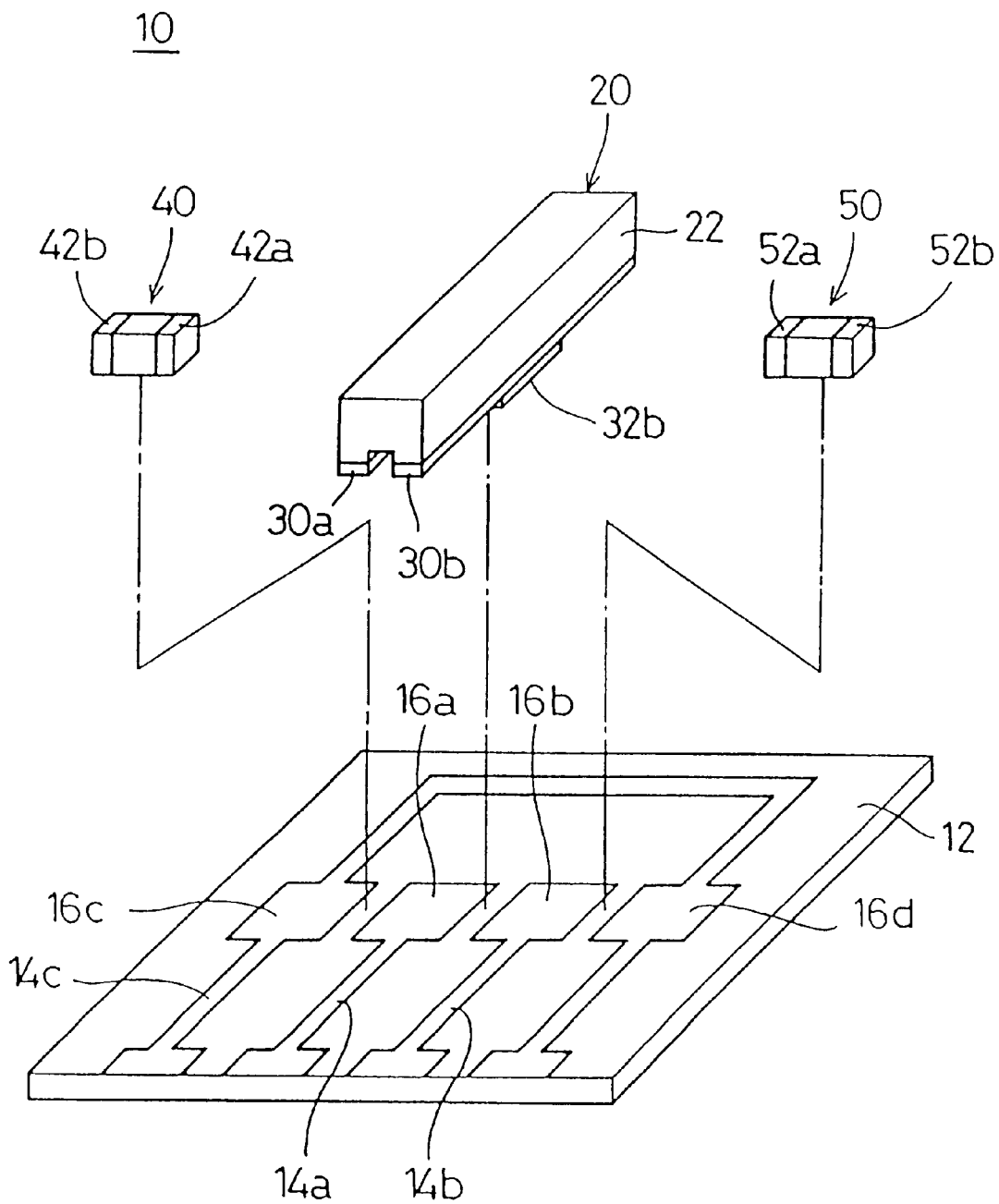
FIG. 3 is an exploded perspective view of the capacitor incorporation type oscillator shown in FIG. 1.

A capacitor incorporation type oscillator which represents a preferred embodiment of the present invention will be described below with reference to FIGS. 1 to 7. A capacitor incorporation type oscillator 10 shown in FIG. 1 includes an insulating substrate 12 having, for example, the shape of a substantially rectangular plate.

Three pattern electrodes 14a, 14b, and 14c are preferably provided on one major surface of the insulating substrate 12 and are spaced apart from each other. Each of the pattern electrodes 14a and 14b is preferably formed into the shape of an I which preferably extends from one end to a central portion of the insulating substrate 12. The other pattern electrode 14c is preferably generally U-shaped and extends around the pattern electrodes 14a and 14b and along three sides of the surface of the insulating substrate 12 other than the side from which the pattern electrodes 14a and 14b extend. The pattern electrode 14c has opposite end portions formed at the side of the substrate 12 surface from which the pattern electrodes 14a and 14b extend.

Four lands 16a, 16b, 16c and 16d are preferably formed in a row as portions of the pattern electrodes 14a to 14c while being spaced apart from each other. The lands 16a and 16b are preferably arranged to be end portions of the pattern electrodes 14a and 14b while the lands 16c and 16d are preferably arranged to be intermediate portions of the pattern electrode 14c.

A piezoelectric resonator 20 is connected to the lands 16a and 16b of the pattern electrodes 14a and 14b. The piezoelectric resonator 20 will be described below in detail particularly with respect to its specific structure.

The piezoelectric resonator 20 includes a base member 22 having, for example, the shape of a substantially rectangular block. The base member 22 includes a plurality of piezoelectric layers 22a formed of, for example, a piezoelectric ceramic. A plurality of internal electrodes 24 are respectively provided on two major surfaces of the piezoelectric layers 22a and arranged substantially perpendicular to the longitudinal direction of the base member 22 in a middle section of the base member 22 preferably defined by sectioning the base member 22 in the longitudinal direction of the base member 22. That is, the internal electrodes 24 are suitably spaced apart from each other with major surfaces arranged substantially perpendicular to the longitudinal direction of the base member 22. The piezoelectric layers 22a located in the middle section of the base member 22 are preferably polarized along the longitudinal direction of the base member 22 in such a manner that the pair of the piezoelectric layers 22a on the opposite sides of each internal electrode 24 are polarized in opposite directions, as indicated by the arrows in FIG. 6. However, the piezoelectric layers 22a located at the two end sections of the base member 22 at the opposite ends in the longitudinal direction of the base member are preferably not polarized.

Figure 6:
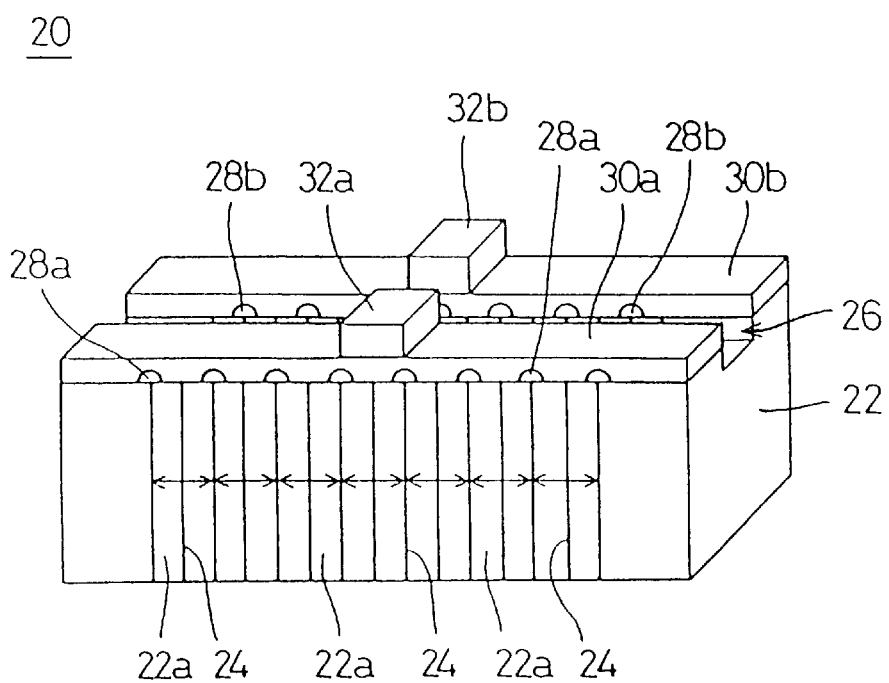
FIG. 6 is a diagram for explaining the structure of the piezoelectric resonator shown in FIG. 5.
Figure 7:
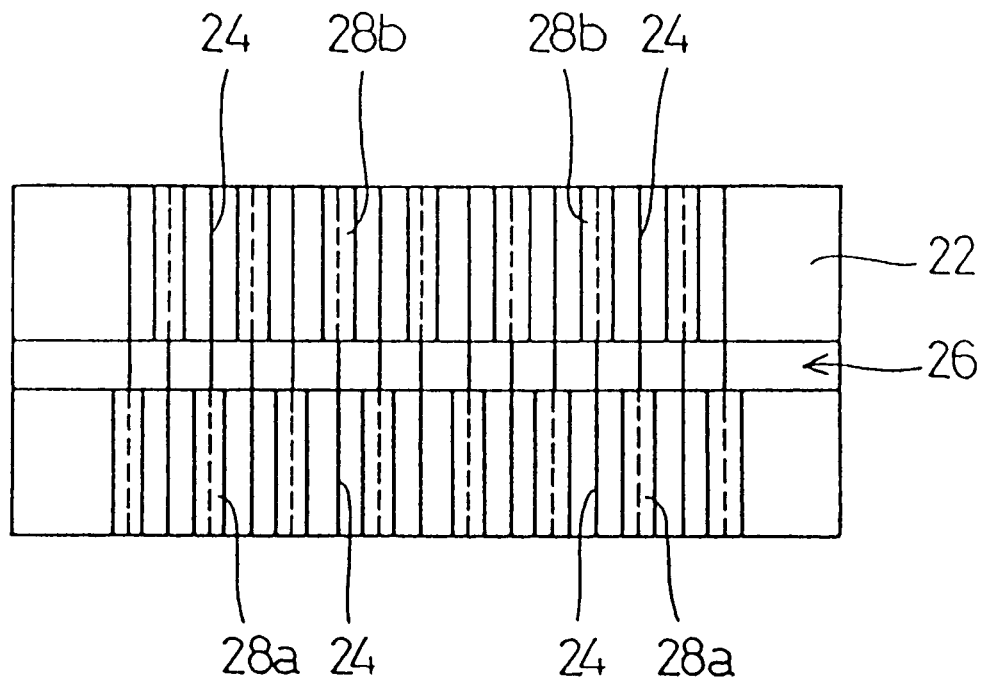
FIG. 7 is a plan view of an essential portion of the piezoelectric resonator shown in FIG. 5.

In one side surface of the base member 22, a groove 26 is preferably formed so as to extend in the longitudinal direction of the base member 22. The groove 26 is preferably formed at the approximate center in the widthwise direction of the base member 22 to bisect the side surface of the base member 22. As shown in FIG. 6, on the side surface divided by the groove 26, a first insulating film 28a and a second insulating film 28b are preferably provided. Edges of the internal electrodes 24 exposed in one of the two portions of the side surface of the base member 22 bisected by the groove 26 are alternately covered and left uncovered with the first insulating film 28a. Edges of the internal electrodes 24 which are exposed in the other of the two portions of the side surface of the base member 22 bisected by the groove 26 and which are opposite from those not covered with the first insulating film 28a are covered with the second insulating film 28b.

Further, external electrodes 30a and 30b are provided on the portions of the base member 22 on which the first and second insulating films 28a and 28b are provided, i.e., on the opposite sides of the groove 26. Therefore, the internal electrodes 24 not covered with the first insulating film 28a are connected to the external electrode 30a while the internal electrodes 24 not covered with the second insulating film 28b are connected to the external electrode 30b. That is, in each adjacent pair of the internal electrodes 24, one electrode 24 is connected to the external electrode 30a or 30b while the other electrode 24 is connected to the external electrode 30a or 30b.

Supporting members 32a and 32b are respectively provided on the external electrodes 30a and 30b preferably at the approximate center of the electrodes 30a, 30b in the longitudinal direction of the base member. These supporting members 32a and 32b are preferably formed of an electroconductive material.

In this piezoelectric resonator 20, the external electrodes 30a and 30b are preferably used as input/output electrodes. When the piezoelectric resonator 20 is operated, an electric field is applied to the polarized portion between each adjacent pair of the internal electrodes 24 located in the middle section of the base member 22. The base member 22 is thereby preferably made piezoelectrically active in the middle section. Since at this time a voltage is applied in opposite directions to the portions of the base member 22 polarized in opposite directions, the base member as an integral unit 20 expands and contracts in the same direction.

As a result, in the entire piezoelectric resonator 20, vibration is excited in the longitudinal fundamental mode with a node being defined at the approximate center of the base member 22 in the longitudinal direction. The base member 22 is preferably not polarized in its two end sections at the opposite ends in the longitudinal direction. These sections of the base member 22 are preferably not polarized and no electric fields are applied thereto since no electrodes are formed therein. Therefore, these opposite end sections are preferably piezoelectrically inactive.

In the piezoelectric resonator 20, the direction of polarization of the base member 22, the direction of each electric field according to an input signal and the direction of vibration of the base member 22 are the same. That is, the piezoelectric resonator 20 is a stiffened type resonator. The stiffened piezoelectric resonator 20 has a larger electromechanical coupling coefficient than an unstiffened piezoelectric resonator in which the direction of vibration differs from the direction of polarization and the direction of an electric field. Therefore, the piezoelectric resonator 20 has an increased range of selection of the difference ΔF between the resonant frequency and the antiresonant frequency in comparison with the conventional piezoelectric resonator. This means that the piezoelectric resonator 20 has a larger band width in comparison with the conventional unstiffened piezoelectric resonator.

Figure 8:
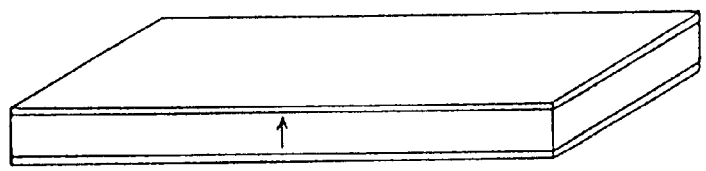
FIG. 8 is a perspective view of an unstiffened piezoelectric resonator capable of vibrating in the longitudinal direction and provided as a comparative example.
Figure 9:
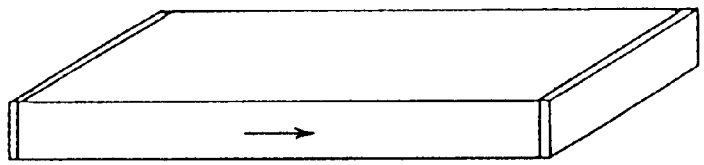
FIG. 9 is a perspective view of a stiffened piezoelectric resonator capable of vibrating in the longitudinal direction.
Figure 10:
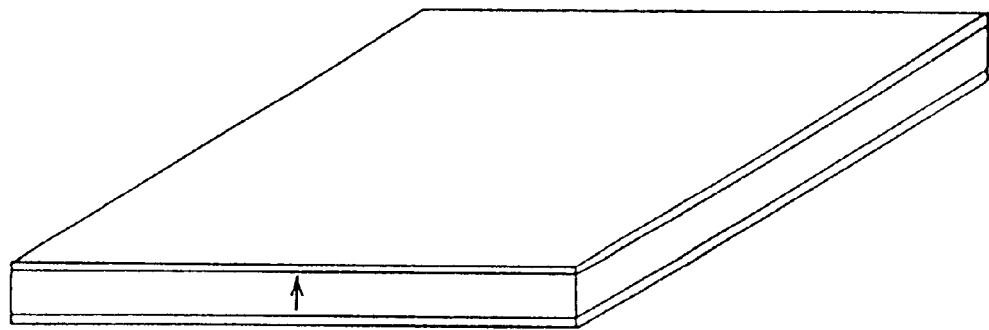
FIG. 10 is a perspective view of an unstiffened piezoelectric resonator capable of vibrating in the plane direction and provided as a comparative example.

To measure differences between stiffened and unstiffened piezoelectric resonators, piezoelectric resonators shown in FIGS. 8, 9, and 10 were made. The piezoelectric resonator shown in FIG. 8 was made by forming electrodes on both surfaces in the thickness direction of a piezoelectric substrate measuring approximately 4.0 mm by 1.0 mm by 0.38 mm. This piezoelectric resonator was polarized in the thickness direction and was adapted to vibrate in the longitudinal direction when a signal was applied to the electrodes. The piezoelectric resonator shown in FIG. 9 had the same dimensions as the piezoelectric resonator shown in FIG. 8. Electrodes were formed on both surfaces so as to extend in the longitudinal direction of a piezoelectric substrate. The piezoelectric resonator was polarized in the longitudinal direction and was adapted to vibrate in the longitudinal direction when a signal was applied to the electrodes. The piezoelectric resonator shown in FIG. 10 was made by forming electrodes on both surfaces in the thickness direction of a piezoelectric substrate measuring approximately 4.7 mm by 4.7 mm by 0.38 mm. This piezoelectric resonator was polarized in the thickness direction and was adapted to vibrate in the plane direction when a signal was applied to the electrodes. The piezoelectric resonators shown in FIGS. 8 and 10 were the unstiffened type resonator while the piezoelectric resonator shown in FIGS. 9 was a stiffened type resonator.

The resonant frequency Fr and the electromechanical coupling coefficient K of each of these piezoelectric resonators were measured. The results of these measurements are shown in Tables 1, 2, and 3. Table 1 shows the measured values of the piezoelectric resonator shown in FIG. 8. Table 2 shows the measured values of the piezoelectric resonator shown in FIG. 9. Table 3 shows the measured values of the piezoelectric resonator shown in FIG. 10.

TABLE 1

|  | Longitudinal Fundamental Vibration | Longitudinal Triple Wave | Width Mode Vibration |
| --- | --- | --- | --- |
| Resonant Frequency (MHz) | 0.460 | 1.32 | 1.95 |
| Electromechanical Coupling Coefficient (%) | 18.9 | 3.9 | 25.2 |

TABLE 2

|  | Longitudinal Fundamental Vibration | Longitudinal Triple Wave | Width Mode Vibration |
| --- | --- | --- | --- |
| Resonant Frequency (MHz) | 0.455 | 1.44 | 1.96 |
| Electromechanical Coupling Coefficient (%) | 42.9 | 12.2 | 4.0 |

TABLE 3

|  | Plane Direction Fundamental Vibration | Plane Direction Triple Wave | Thickness Mode Vibration |
| --- | --- | --- | --- |
| Resonant Frequency (MHz) | 0.458 | 1.25 | 5.65 |
| Electromechanical Coupling Coefficient (%) | 35.0 | 11.5 | 23.3 |

As can be seen from these tables, the stiffened piezoelectric resonator had a larger electromagnetic coupling coefficient K than the unstiffened piezoelectric resonators and, therefore, had a larger difference ΔF between the resonant frequency and the antiresonant frequency than the unstiffened piezoelectric resonators. The largest spurious vibration of the stiffened piezoelectric resonator was a longitudinal triple wave and the electromagnetic coupling coefficient K was 12.2% with respect to this vibration while the electromagnetic coupling coefficient K with respect to width-mode vibration different from the fundamental vibration was small, about 4.0%. In contrast, the unstiffened longitudinal-vibration piezoelectric resonator had a large electromagnetic coupling coefficient K of 25.2% in the width mode and the unstiffened plane-direction vibration piezoelectric resonator had a large electromagnetic coupling coefficient K of 23.3% in the thickness mode. Thus, it is understood that the stiffened piezoelectric resonator had smaller spurious vibrations than the unstiffened piezoelectric resonators.

With the piezoelectric resonator used in the preferred embodiments of the present invention, the capacitance of the piezoelectric resonator 20 can easily be adjusted by, for example, changing the area of the opposed surfaces of internal electrodes 24, the number of piezoelectric layers 22a and the number of internal electrodes 24, and/or the size of the piezoelectric layers 22a in the longitudinal direction of the base member 22. That is, the capacitance of the resonator can be increased by increasing the area of the opposed surfaces of internal electrodes 24, by increasing the number of piezoelectric layers 22a and the number of internal electrodes 24 and/or by reducing the size of the piezoelectric layers 22a in the longitudinal direction of the base member 22. Conversely, the capacitance of the resonator can be reduced by reducing the area of the opposed surfaces of internal electrodes 24, by reducing the number of piezoelectric layers 22a and the number of internal electrodes 24 and/or by increasing the size of the piezoelectric layers 22a in the longitudinal direction of the base member 22. Because of this capacitance adjustment by changing the area of the opposed surfaces of internal electrodes 24, the number of piezoelectric layers 22a and the number of internal electrodes 24, and/or the size of the piezoelectric layers 22a in the longitudinal direction of the base member 22, the degree of freedom and flexibility in capacitance design of the piezoelectric resonator 20 is high. Therefore, the piezoelectric resonator 20 can easily achieve impedance matching with an external circuit when used by being mounted on a circuit board or the like.

In the capacitor incorporation type oscillator 10, the supporting members 32a and 32b are preferably bonded to the lands 16a and 16b of the pattern electrodes 14a and 14b, respectively, preferably by an electroconductive adhesive at the approximate center of the piezoelectric resonator 20 in the longitudinal direction. The external electrodes 30a and 30b of the piezoelectric resonator 20 are thereby connected electrically to the pattern electrodes 14a and 14b, respectively.

In the capacitor incorporation type oscillator 10, two electrodes of an electronic component element, e.g., external electrodes 42a and 42b of a chip capacitor 40 are bonded to the lands 16a and 16c of the pattern electrodes 14a and 14c, respectively, preferably by an electroconductive adhesive. The external electrodes 42a and 42b of the capacitor 40 are thereby connected electrically to the pattern electrodes 14a and 14c, respectively.

Further, two electrodes of an electronic component element, e.g., external electrodes 52a and 52b of a chip capacitor 50 are bonded to the lands 16b and 16d of the pattern electrodes 14b and 14c, respectively, by an electroconductive adhesive. The external electrodes 52a and 52b of the capacitor 50 are thereby connected electrically to the pattern electrodes 14b and 14c, respectively.

Figure 4:
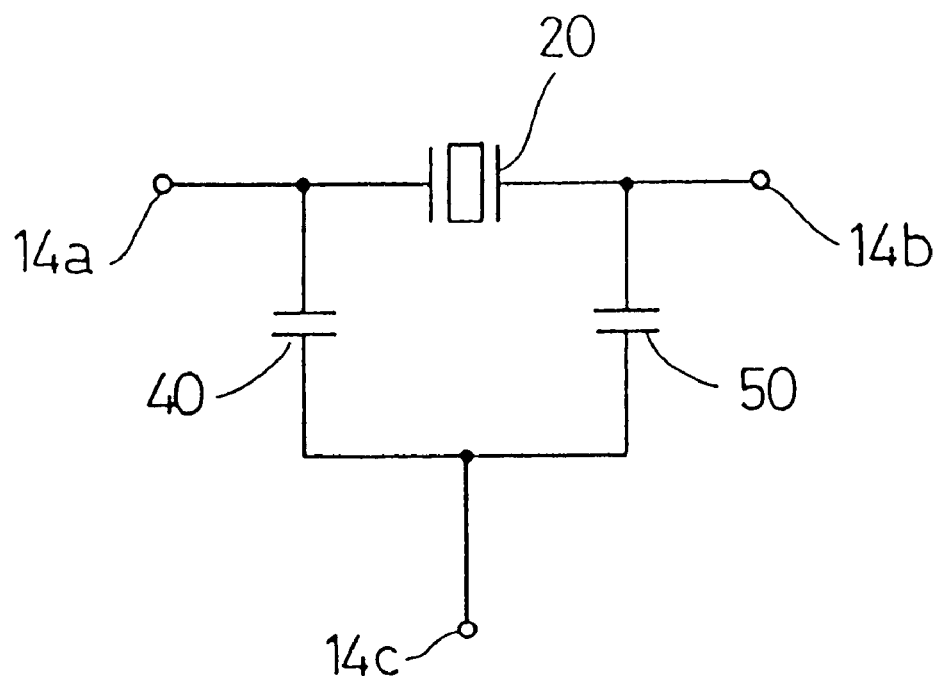
FIG. 4 is a circuit diagram of the capacitor incorporation type oscillator shown in FIG. 1.
Figure 5:
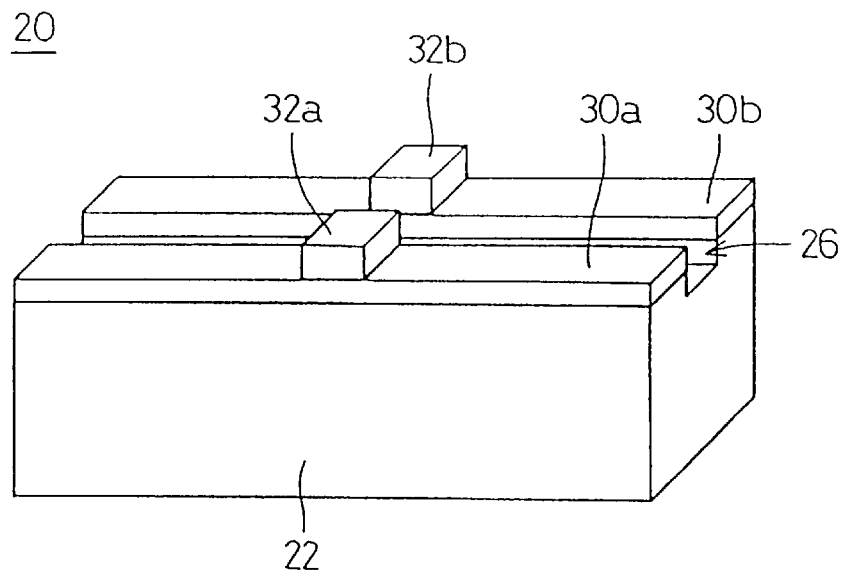
FIG. 5 is a perspective view of a piezoelectric resonator used in the capacitor incorporation type oscillator shown in FIG. 1.

Consequently, the capacitor incorporation type oscillator 10 has a π-type circuit shown in FIG. 4.

In the capacitor incorporation type oscillator 10, a metallic cap (not shown) is preferably placed on the insulating substrate 12 so as to cover the piezoelectric resonator 20 and the capacitors 40 and 50. To prevent the metallic cap from being short-circuited to the pattern electrodes 14a to 14c, an insulating resin is preferably applied to the insulating substrate 12 and the pattern electrodes 14a and 14c.

As described above, the capacitor incorporation type oscillator 10 has the piezoelectric resonator 20 having reduced spurious vibrations and having an increased range of selection of the difference ΔF between the resonance frequency and the antiresonant frequency.

In the capacitor incorporation type oscillator 10, there is no need for any conductor wire since the external electrodes 30a, 30b, 42a, 42b, 52a, and 52b of the piezoelectric resonator 20 and the capacitors 40 and 50 provided as electronic component elements are directly connected to the pattern electrodes 14a to 14c on the insulating substrate 12 by the supporting members 32a and 32b. Therefore, the overall size of the capacitor incorporation type oscillator 10 is substantially reduced.

In the capacitor incorporation type oscillator 10, two adjacent external electrodes of two electronic component elements arranged adjacent to each other are preferably placed on the lands of one pattern electrode to be connected to the pattern electrode electrically and mechanically. Therefore, there is no need for insulation between the two external electrodes, thereby allowing the electronic component elements arranged adjacent to each other to be placed close to each other without negatively affecting resonator characteristics. This connection structure also contributes to the reduction in size of the component.

In the capacitor incorporation type oscillator 10, simpler pattern electrodes disposed on the insulating substrate may suffice for connection of electronic component elements without complicated pattern electrodes since the connection structure is such that two adjacent external electrodes of two electronic component elements disposed adjacent to each other are placed on the lands of one pattern electrode to be connected to the pattern electrode electrically and mechanically. The overall size of the capacitor incorporation type oscillator 10 is reduced by simplifying the pattern electrodes.

In the capacitor incorporation type oscillator 10, damping of vibration of the piezoelectric resonator 20 due to proximity to the insulating substrate 12 is limited because the piezoelectric resonator 20 is supported and suitably spaced apart from the insulating substrate 12 by the supporting members 32a and 32b which are preferably located at the node of the resonator 20.

Since the supporting members 32a and 32b are disposed on the piezoelectric resonator 20 preferably at a node of the resonator 20 in the capacitor incorporation type oscillator 10, the piezoelectric resonator 20 can easily be supported by only fixing the supporting members 32a and 32b so that its vibration is not damped.

Figure 11:
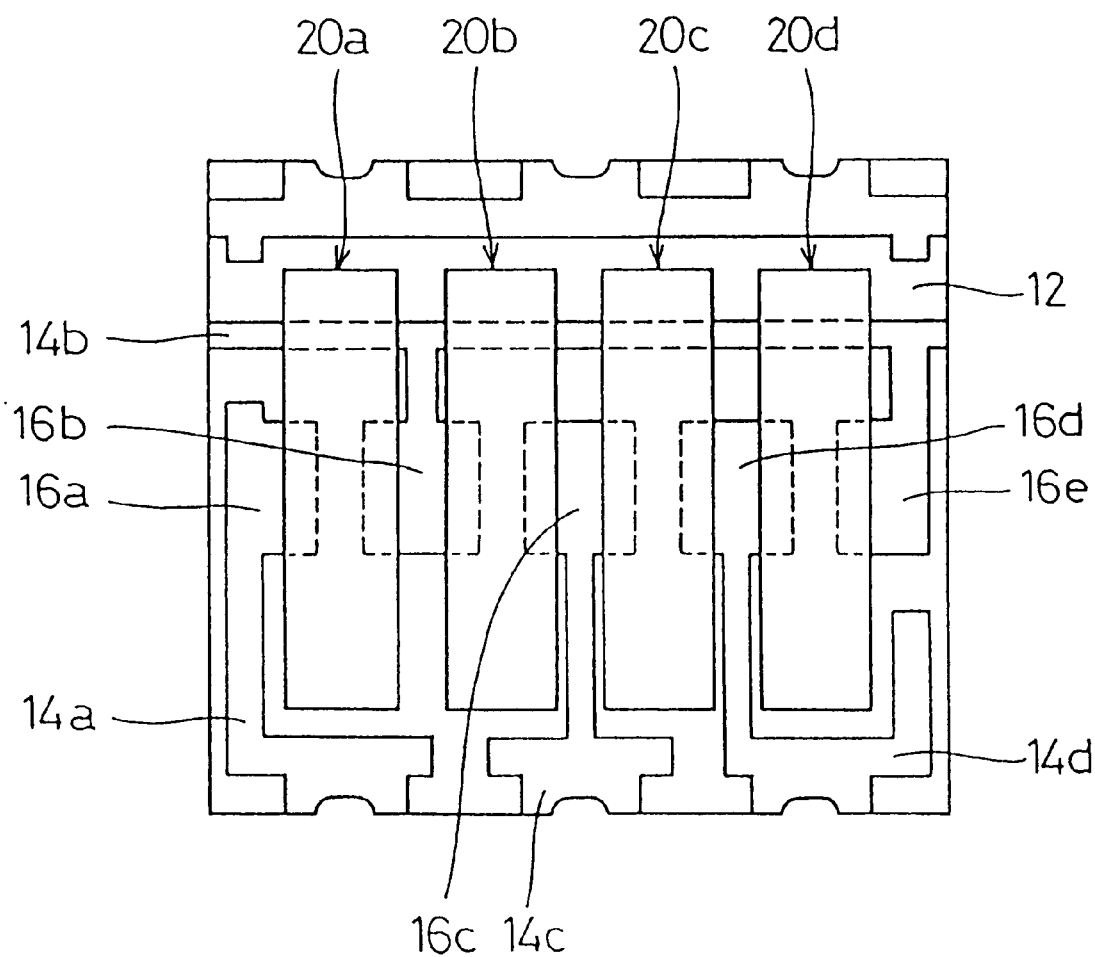
FIG. 11 is a plan view of an example of a ladder filter in accordance with the preferred embodiments of the present invention.
Figure 12:
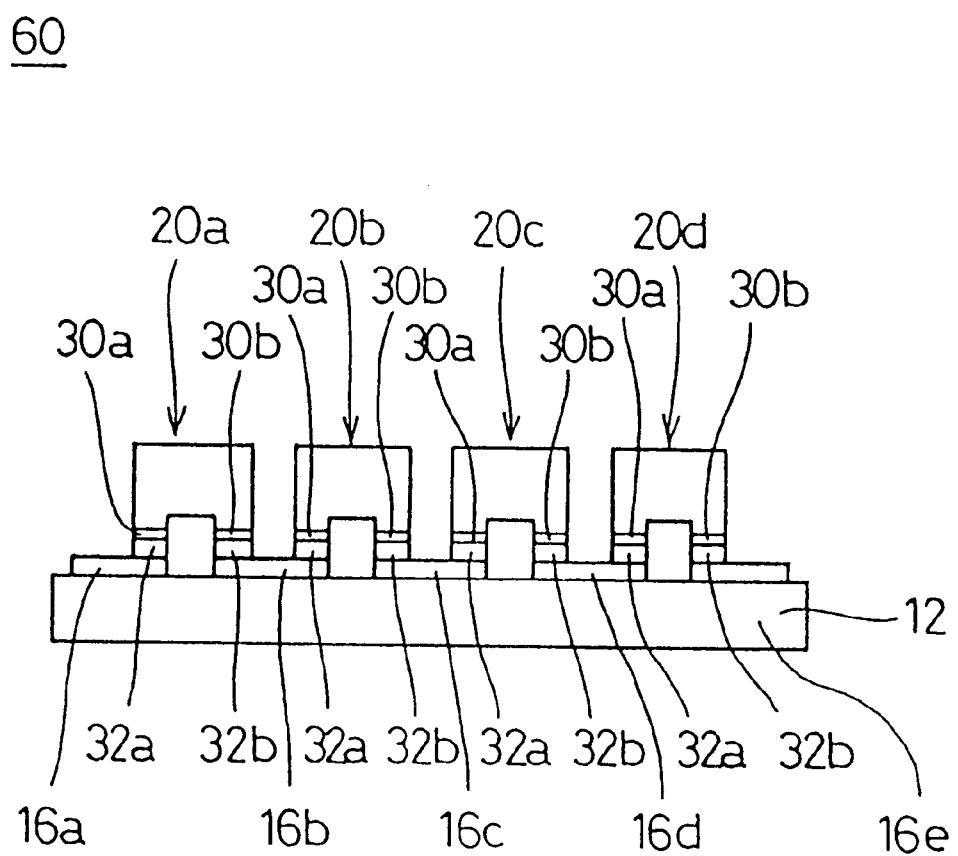
FIG. 12 is a front view of the ladder filter shown in FIG. 11.
Figure 13:
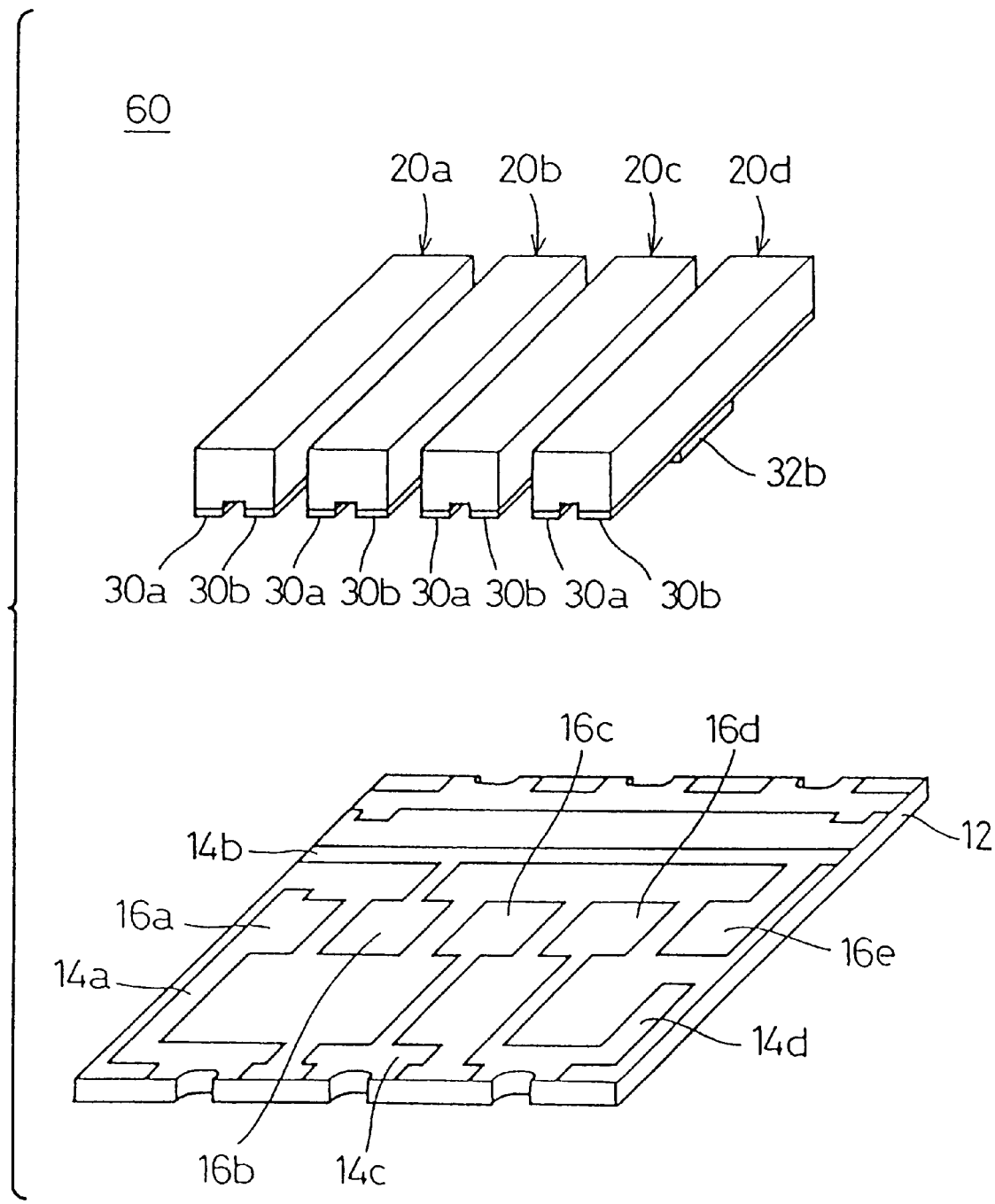
FIG. 13 is an exploded perspective view of the ladder filter shown in FIG. 11.
Figure 14:
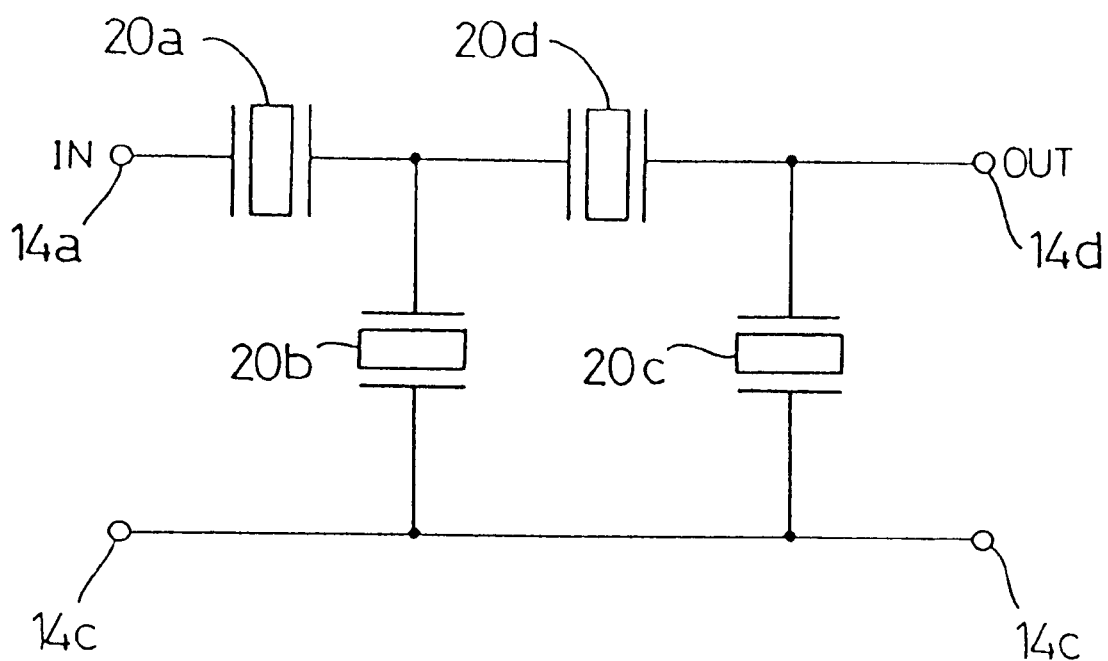
FIG. 14 is a circuit diagram of the ladder filter shown in FIG. 11.

FIG. 11 is a plan view of a ladder filter 60 which represents a second preferred embodiment of the present invention, and FIGS. 12, 13, and 14 are a front view, an exploded perspective view, and a circuit diagram, respectively, of the ladder filter shown in FIG. 11. The ladder filter 60 shown in FIG. 11 includes an insulating substrate 12 having, for example, the shape of a substantially rectangular plate.

Four pattern electrodes 14a, 14b, 14c, and 14d are preferably provided on one major surface of the insulating substrate 12 while being spaced apart from each other. The pattern electrode 14a extends from one side of the substrate 12 surface so as to be generally L-shaped along the contour of the substrate 12 surface at one corner of the substrate 12. The pattern electrode 14b preferably has a straight portion extending along the side of the substrate 12 surface opposite from the side from which the pattern electrode 14a extends, a portion extending from an intermediate position on the straight portion to a central portion of the substrate 12, and a portion extending from a position in the vicinity of one end of the straight portion and along a near edge of the substrate 12. The pattern electrode 14c is generally I-shaped and has one end disposed at the approximate of the insulating substrate 12 and the other end disposed adjacent to the side of the substrate 12 surface from which the pattern electrode 14a extends. The pattern electrode 14d is generally L-shaped and has one end disposed near the center of the insulating substrate 12 and an intermediate portion disposed adjacent to the side of the substrate 12 surface from which the pattern electrode 14 extends.

Five lands 16a, 16b, 16c, 16d, and 16e are arranged in a row as portions of the pattern electrodes 14a to 14d while being suitably spaced apart from each other. The lands 16a to 16d are respectively arranged to be end portions of the pattern electrodes 14a to 14d while the land 16e is preferably arranged to be the other end portion of the pattern electrode 14b.

Four piezoelectric resonators 20a, 20b, 20c, and 20d provided as electronic component elements are placed on the lands 16a to 16e of the pattern electrodes 14a to 14d by being arranged in this order. Each of the piezoelectric resonators 20a to 20d preferably has the same structure as the above-described piezoelectric resonator 20. However, two piezoelectric resonators 20a and 20d are used as series resonators while the other two piezoelectric resonators 20b and 20c are used as parallel resonators. Accordingly, the piezoelectric resonators 20a to 20d are designed so that the capacitance of the parallel piezoelectric resonators 20b and 20c is markedly larger than the capacitance of the series piezoelectric resonators 20a and 20d.

That is, the supporting members 32a and 32b of the piezoelectric resonator 20a provided as the first series piezoelectric resonator are bonded to the lands 16a and 16b of the pattern electrodes 14a and 14b, respectively, by an electroconductive adhesive. The external electrodes 30a and 30b of the piezoelectric resonator 20a are thereby connected to the pattern electrodes 14a and 14b, respectively.

Also, the supporting members 32a and 32b of the piezoelectric resonator 20b provided as the first parallel piezoelectric resonator are preferably bonded to the lands 16b and 16c of the pattern electrodes 14b and 14c, respectively, preferably by an electroconductive adhesive. The external electrodes 30a and 30b of the piezoelectric resonator 20b are thereby connected to the pattern electrodes 14b and 14c, respectively.

Also, the supporting members 32a and 32b of the piezoelectric resonator 20c provided as the second parallel piezoelectric resonator are preferably bonded to the lands 16c and 16d of the pattern electrodes 14c and 14d, respectively, preferably by an electroconductive adhesive. The external electrodes 30a and 30b of the piezoelectric resonator 20c are thereby connected to the pattern electrodes 14c and 14d, respectively.

Further, the supporting members 32a and 32b of the piezoelectric resonator 20d provided as the second series piezoelectric resonator are preferably bonded to the lands 16d and 16e of the pattern electrodes 14d and 14b, respectively, preferably by an electroconductive adhesive. The external electrodes 30a and 30b of the piezoelectric resonator 20d are thereby connected to the pattern electrodes 14d and 14b, respectively.

Consequently, the ladder filter 60 has a ladder type circuit shown in FIG. 14. That is, in the ladder filter 60, the pattern electrode 14a is used as an input terminal, the pattern electrode 14d is used as an output terminal, and the pattern electrode 14c is used as a grounding terminal.

In the ladder filter 60, a metallic cap (not shown) is preferably placed on the insulating substrate 12 so as to cover the piezoelectric resonators 20a to 20d. To prevent the metallic cap from being short-circuited to the pattern electrodes 14a to 14d, an insulating resin is preferably applied to the insulating substrate 12 and the pattern electrodes 14a to 14d.

The ladder filter 60 has the piezoelectric resonators 20a to 20d each having reduced spurious vibrations and having an increased range of selection of the difference ΔF between the resonance frequency and the antiresonant frequency, as does the above-described oscillator 10.

In the ladder filter 60, there is no need for any conductor wire since the external electrodes 30a and 30b of the piezoelectric resonators 20a to 20d provided as electronic component elements are directly connected to the pattern electrodes 14a to 14d on the insulating substrate 12 by the supporting members 32a and 32b. Therefore, the overall size of the ladder filter 60 is reduced.

In the ladder filter 60, two adjacent external electrodes of each adjacent pair of the piezoelectric resonators are preferably placed on the lands of one pattern electrode to be connected to the pattern electrode electrically and mechanically. Therefore, there is no need for insulation between the external electrodes and the electronic component elements arranged adjacent to each other can be located close to each other. This arrangement also enables the electronic component and the size of the ladder filter to be substantially reduced.

Since in the ladder filter 60 two adjacent external electrodes of each adjacent pair of the piezoelectric resonators are placed on the lands of one pattern electrode to be connected to the pattern electrode electrically and mechanically, simpler pattern electrodes provided on the insulating substrate may suffice for connection of electronic component elements thereby making complicated pattern electrodes unnecessary. This connection structure also contributes to the reduction in size of the component.

In the ladder filter 60, damping of vibration of the piezoelectric resonators 20a to 20d due to proximity to the insulating substrate 12 is limited because the piezoelectric resonators 20a to 20d are supported and suitably spaced apart from the insulating substrate 12 by the supporting members 32a and 32b preferably mounted at their nodes.

Since the supporting members 32a and 32b are preferably provided on the piezoelectric resonators 20a to 20d at nodes of the resonators in the ladder filter 60, the piezoelectric resonators 20a to 20d can easily be supported by fixing only the supporting members 32a and 32b so that their vibrations are not damped.

The attenuation in the ladder filter is influenced by the capacitance ratio of the parallel resonators and the series resonators. The capacitance of each of the piezoelectric resonators 20a to 20d can be adjusted by, for example, changing the area of the opposed surfaces of internal electrodes 24, the number of piezoelectric layers 22a and the number of internal electrodes 24, and/or the size of the piezoelectric layers 22a in the longitudinal direction of the base member 22. Therefore, if the capacitance of the piezoelectric resonators 20a to 20d is adjusted, the ladder filter 60 can be realized as a filter having a smaller number of resonators and having a larger amount of attenuation in comparison with those using conventional unstiffened piezoelectric resonators. Also, since the range of selection of ΔF of the piezoelectric resonators 20a to 20d can be increased relative to that in the conventional piezoelectric resonators, the ladder filter 60 can have a larger pass band width than filters using conventional piezoelectric resonators.

Figure 15:
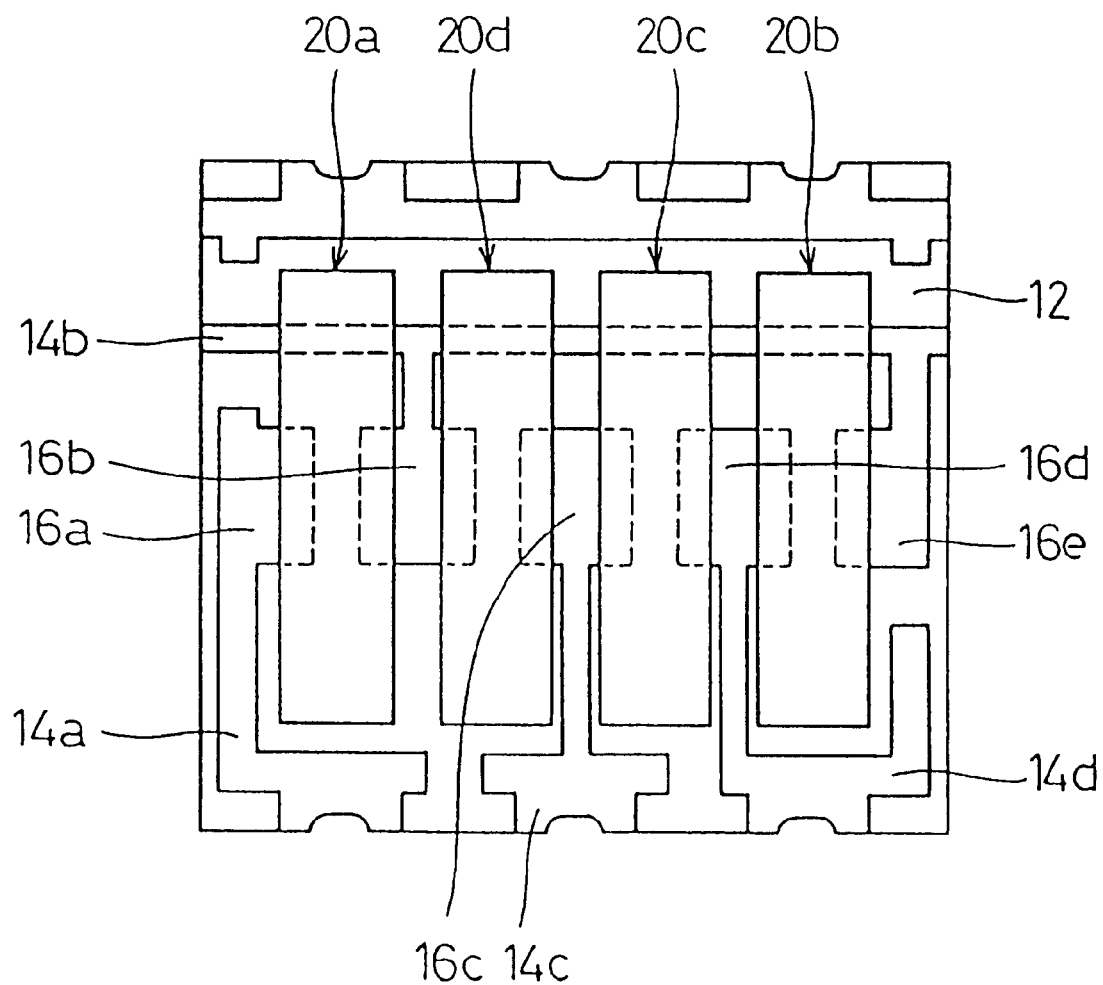
FIG. 15 is a plan view of another example of the ladder filter in accordance with the preferred embodiments of the present invention.
Figure 16:
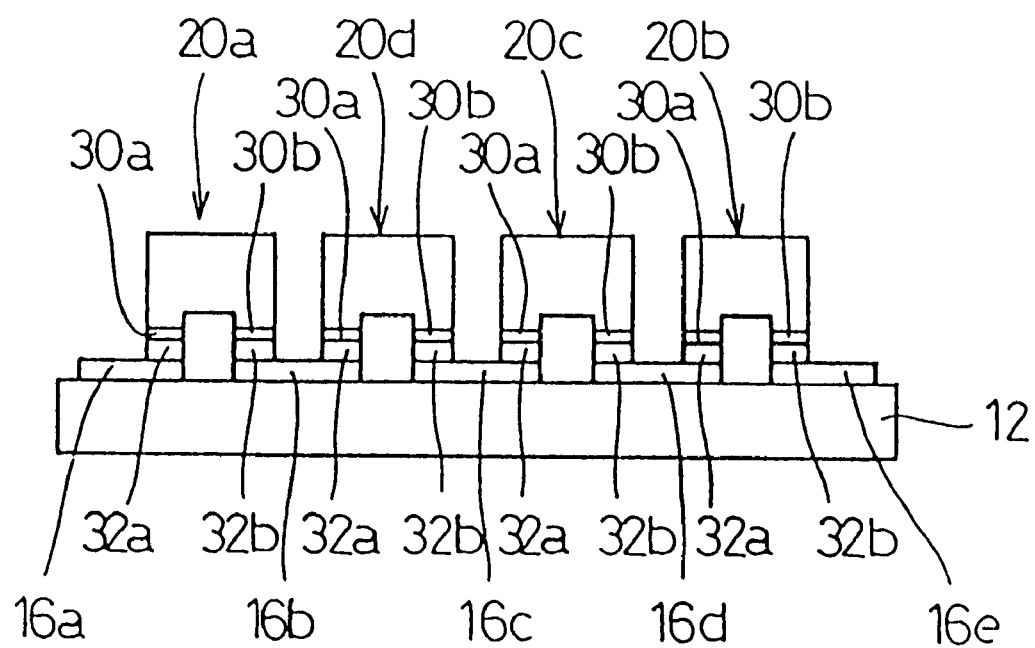
FIG. 16 is a front view of the ladder filter shown in FIG. 15.
Figure 17:
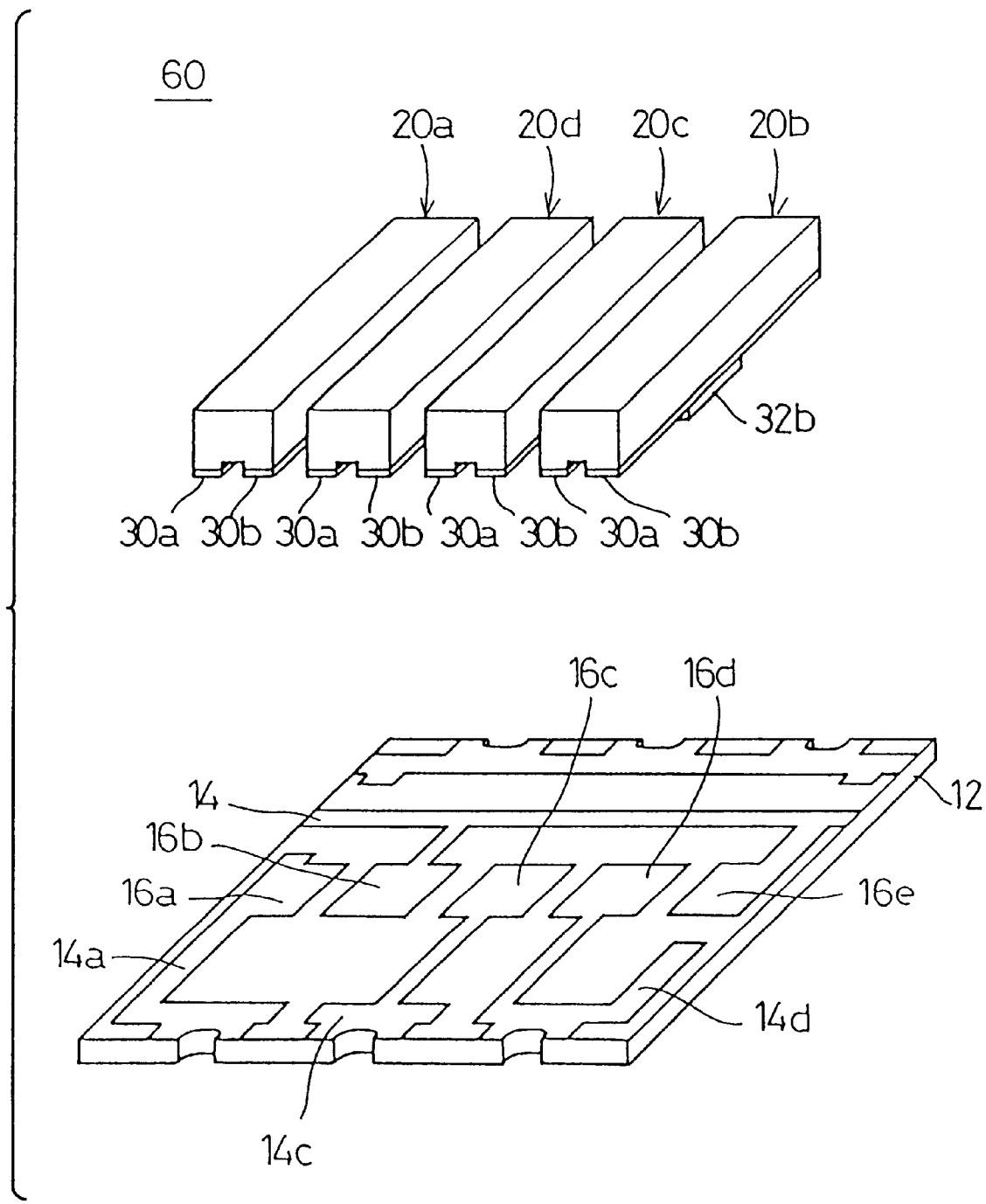
FIG. 17 is an exploded perspective view of the ladder filter shown in FIG. 15.
Figure 18:
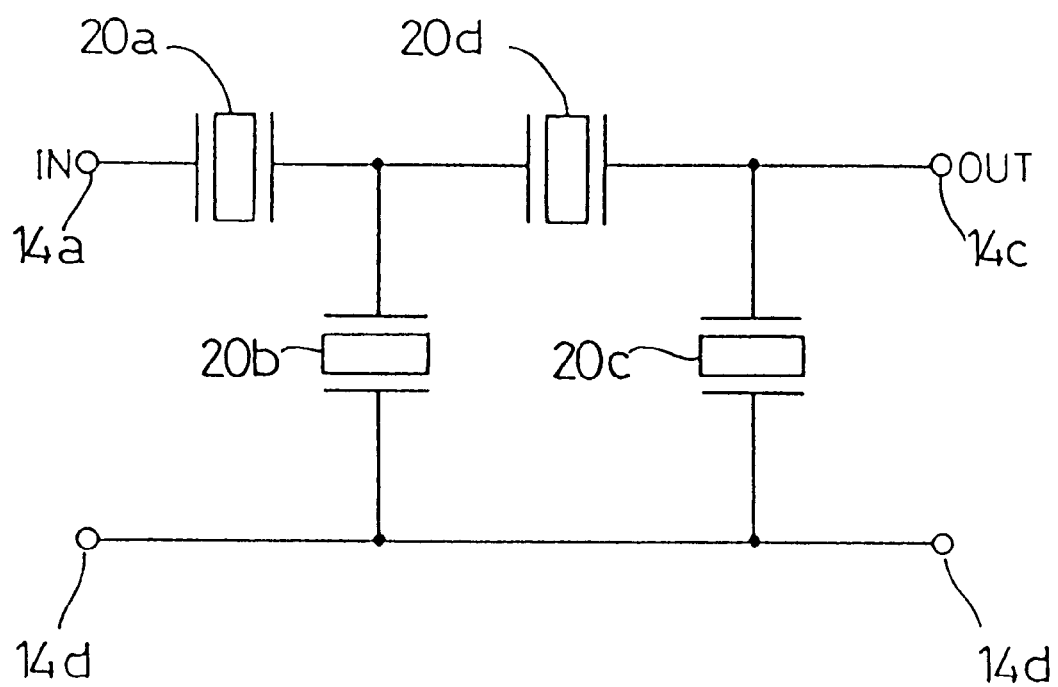
FIG. 18 is a circuit diagram of the ladder filter shown in FIG. 15.
Figure 19:
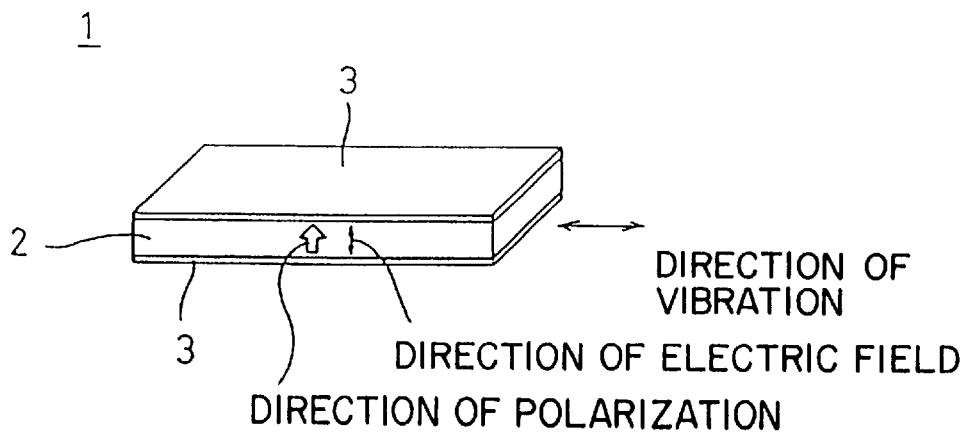
FIG. 19 is a perspective view of a conventional piezoelectric resonator.
Figure 20:
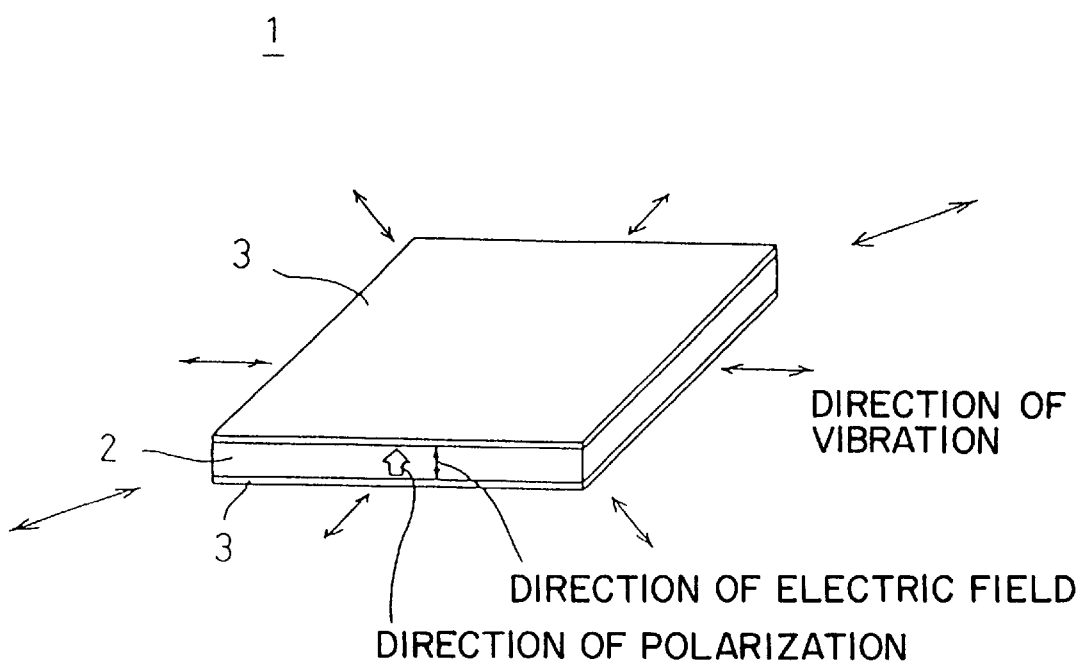
FIG. 20 is a perspective view of another conventional piezoelectric resonator.
Figure 21:
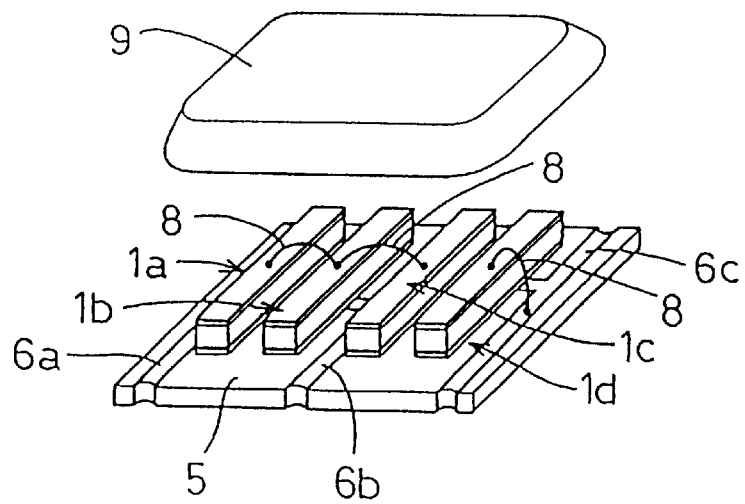
FIG. 21 is an exploded perspective view of a ladder filter using the piezoelectric resonator related to the present invention.
Figure 22:
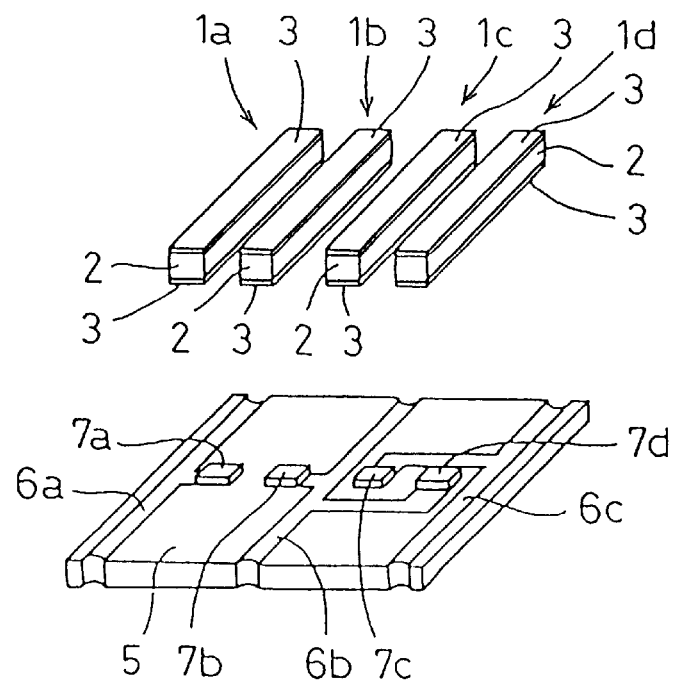
FIG. 22 is an exploded perspective view of essential elements of the ladder filter shown in FIG. 23.
Figure 23:
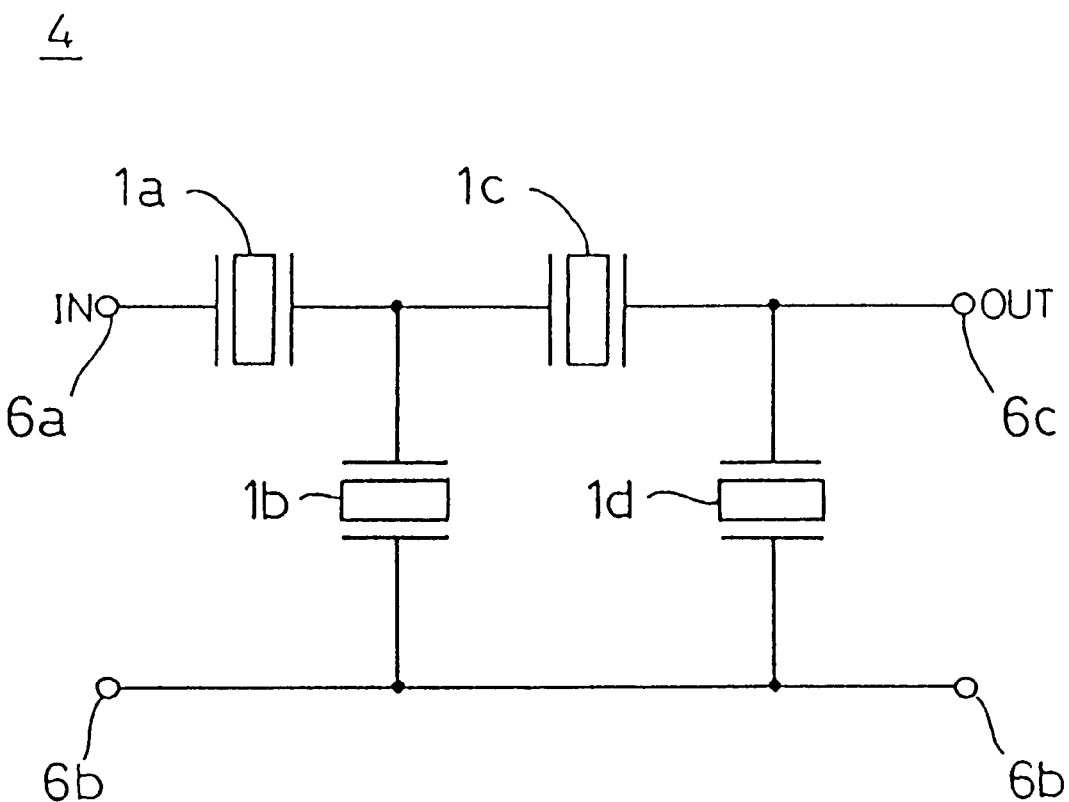
FIG. 23 is a circuit diagram of the ladder filter shown in FIG. 21.

FIG. 15 is a plan view of a ladder filter 60 which represents a third preferred embodiment of the present invention, and FIGS. 16, 17, and 18 are a front view, an exploded perspective view, and a circuit diagram, respectively, of the ladder filter shown in FIG. 15. The ladder filter 60 shown in FIGS. 15 to 18 differs from that shown in FIGS. 11 to 14 only in the placement of the piezoelectric resonator 20b provided as the first parallel resonator and the piezoelectric resonator 20d provided as the second series resonator.

That is, in the ladder filter 60 shown in FIGS. 15 to 18, the supporting members 32a and 32b of the piezoelectric resonator 20d provided as the second series resonator are preferably bonded to the lands 16b and 16c of the pattern electrodes 14b and 14c, respectively, by an electroconductive adhesive. The external electrodes 30a and 30b of the piezoelectric resonator 20d are thereby connected to the pattern electrodes 14b and 14c, respectively.

Also, the supporting members 32a and 32b of the piezoelectric resonator 20d provided as the first parallel resonator are preferably bonded to the lands 16d and 16e of the pattern electrodes 14d and 14b, respectively, by an electroconductive adhesive. The external electrodes 30a and 30b of the piezoelectric resonator 20b are thereby connected to the pattern electrodes 14d and 14b, respectively.

Consequently, this ladder filter 60 has a ladder type circuit shown in FIG. 18. That is, in this ladder filter 60, the pattern electrode 14a is used as an input terminal, the pattern electrode 14c is used as an output terminal, and the pattern electrode 14d is used as a grounding terminal.

The ladder filter 60 shown in FIGS. 15 to 18 provides the advantages of the preferred embodiments as shown in FIGS. 11 to 14.

The base member 22 of the piezoelectric resonator 20, and 20a to 20d of the above-described capacitor incorporation type oscillator and the ladder filters 60 may have a groove 26 formed in one side surface. However, it is not always necessary to form such a groove 26 in the base member.

In each of the piezoelectric resonators 20, 20a to 20d of the above-described oscillator and filters, the longitudinal direction end sections of the base member 22 are preferably piezoelectrically inactive. However, any portion other than the longitudinal direction end sections of the base member 22 may be formed as such a piezoelectrically inactive section, or the entire base member 22 may be formed so as to be piezoelectrically active through its overall length.

In the electronic component and ladder filter of the preferred embodiments of the present invention, any other type of piezoelectric resonator capable of being mounted in a surface mount manner and vibrating in the longitudinal vibration mode may be used.

In the electronic component and ladder filter of the preferred embodiments of the present invention, any electronic component element capable of being mounted in a surface mount manner other than the chip capacitor may also be used.

In the electronic component and ladder filter of the preferred embodiments of the present invention, the number of electronic component elements used, including piezoelectric resonators, may be selected as desired.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An electronic component comprising:

a substrate including a plurality of pattern electrodes disposed on said substrate;

at least one electronic component element provided on said substrate;

at least one piezoelectric resonator provided on said substrate, said piezoelectric resonator including a base member comprising an integral unit including a plurality of laminated piezoelectric layers stacked on each other in a stacking direction and each of which is polarized in a thickness direction of the piezoelectric layer and along a longitudinal direction of said base member such that the polarization direction of each of the piezoelectric layers corresponds to the stacking direction, said at least one piezoelectric resonator including a pair of external electrodes disposed on said base member; and means for driving said piezoelectric resonator such that said at least one piezoelectric resonator vibrates in a longitudinal vibration mode in a length direction of said at least one piezoelectric resonator; wherein a first of said pair of external electrodes of said piezoelectric resonator and an external electrode of said electronic component element are disposed adjacent to each other and are disposed on and electrically connected to one of said pattern electrodes.

2. An electronic component according to claim 1, wherein the at least one piezoelectric resonator further comprises a plurality of internal electrodes disposed in the base member and arranged substantially perpendicular to the longitudinal direction of said base member and being spaced apart from each other, said pair of external electrodes being alternately connected to said plurality of internal electrodes.

3. An electronic component according to claim 2, wherein said plurality of internal electrodes are disposed on surfaces of said piezoelectric layers and arranged substantially perpendicular to the longitudinal direction of said base member.

4. An electronic component according to claim 1, wherein said electronic component element comprises at least two capacitors.

5. An electronic component according to claim 1, wherein said electronic component element comprises at least two capacitors, said first of said external electrodes of said piezoelectric resonator and an external electrode of a first of said two capacitors are arranged adjacent to each other and connected to one of said pattern electrodes, and a second of said external electrodes of said piezoelectric resonator and an external electrode of a second of said capacitors are disposed adjacent to each other and connected to another of said pattern electrodes to thereby define a π-type circuit.

6. A ladder filter comprising:

an insulating substrate including a plurality of pattern electrodes disposed on said insulating substrate;

a plurality of piezoelectric resonators provided on said insulating substrate, each of said plurality of piezoelectric resonators including a pair of external electrodes disposed on a respective surface thereof, at least one of the plurality of piezoelectric resonators including a base member comprising an integral unit including a plurality of laminated piezoelectric layers being stacked on each other in a stacking direction and each of which is polarized in a thickness direction of the piezoelectric layer and along a longitudinal direction of said base member such that the polarization direction of each of the piezoelectric layers corresponds to the stacking direction; and means for driving the at least one of the plurality of piezoelectric resonators such that the at least one piezoelectric resonator vibrates in said longitudinal vibration mode in a length direction of the at least one piezoelectric resonator; wherein two of said external electrodes of two of said piezoelectric resonators are disposed adjacent to each other and disposed on and electrically connected to one of said pattern electrodes.

7. An electronic component according to claim 6, wherein said at least one of the plurality of resonators further comprises a plurality of internal electrodes disposed in the base member of the at least one piezoelectric resonator and arranged substantially perpendicular to the longitudinal direction of said base member and being spaced apart from each other, said pair of external electrodes of said at least one of the plurality of piezoelectric resonators being disposed alternately connected to said plurality of internal electrodes.

8. An electronic component according to claim 7, wherein said plurality of internal electrodes are disposed on surfaces of said piezoelectric layers and arranged substantially perpendicular to the longitudinal direction of said base member.

9. An electronic component according to claim 6, wherein each of said plurality of resonators is arranged to generate vibration in a longitudinal vibration mode and comprises an integral unit including a plurality of laminated piezoelectric layers each of which is polarized along the longitudinal direction of said base member.

10. A ladder filter according to claim 6, wherein said plurality of piezoelectric resonators includes four piezoelectric resonators which comprise a first series resonator, a second series resonator, a first parallel resonator and a second parallel resonator, said four piezoelectric resonators being arranged in a row in an order of the first series resonator, the first parallel resonator, the second parallel resonator and the second series resonator.

11. A ladder filter according to claim 6, wherein said plurality of piezoelectric resonators includes four piezoelectric resonators which comprise a first series resonator, a second series resonator, a first parallel resonator and a second parallel resonator, said four piezoelectric resonators being arranged in a row in an order of the first series resonator, the second series resonator, the second parallel resonator and the first parallel resonator.

12. An electronic component comprising:

an insulating substrate including a plurality of pattern electrodes disposed on said insulating substrate;

at least one electronic component element provided on said insulating substrate;

at least one piezoelectric resonator including a base member which comprises an integral unit including a plurality of laminated piezoelectric layers being stacked on each other in a stacking direction and each of which is polarized in a thickness direction of the piezoelectric layer and along a longitudinal direction of said base member such that the polarization direction of each of the piezoelectric layers corresponds to the stacking direction; and means for driving the at least one piezoelectric such that the at least one piezoelectric resonator vibrates in a longitudinal vibration mode in a length direction of the at least one piezoelectric resonator, the at least one piezoelectric resonator including a pair of external electrodes; wherein a first of said pair of external electrodes of said piezoelectric resonator and an external electrode of said electronic component element are arranged adjacent to each other and are disposed on and electrically connected to one of said pattern electrodes.

13. An electronic component according to claim 12, wherein said pair of external electrodes are disposed on one of a common side surface and different side surfaces of said base member.

14. An electronic component according to claim 12, wherein the base member of the at least one piezoelectric resonator includes a plurality of internal electrodes disposed in said base member so as to be substantially perpendicular to the longitudinal direction of said base member and said external electrodes being connected to said plurality of internal electrodes.

15. An electronic component according to claim 14, wherein said plurality of internal electrodes are alternately laminated and an AC electric field in the longitudinal direction of said base member is applied to each of said piezoelectric layers via said plurality of internal electrodes so that longitudinal fundamental vibration is generated in said base member.

* * * * *